United States Patent
Ravi et al.

(10) Patent No.: US 8,856,601 B2
(45) Date of Patent: Oct. 7, 2014

(54) SCAN COMPRESSION ARCHITECTURE WITH BYPASSABLE SCAN CHAINS FOR LOW TEST MODE POWER

(75) Inventors: Srivaths Ravi, Bangalore (IN); Rajesh Kumar Tiwari, Bangalore (IN); Rubin Ajit Parekhji, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 176 days.

(21) Appl. No.: 12/868,253

(22) Filed: Aug. 25, 2010

(65) Prior Publication Data

US 2013/0159800 A1    Jun. 20, 2013

Related U.S. Application Data

(60) Provisional application No. 61/236,753, filed on Aug. 25, 2009.

(51) Int. Cl.
*G01R 31/28* (2006.01)
*G01R 31/3185* (2006.01)
*G01R 31/3177* (2006.01)

(52) U.S. Cl.
CPC .... *G01R 31/3177* (2013.01); *G01R 31/318547* (2013.01)
USPC .......................................... 714/726; 714/727

(58) Field of Classification Search
CPC ............... G01R 31/318335; G01R 31/318536; G01R 31/318541; G01R 31/318555; G01R 31/318544; G01R 31/318572; G01R 31/318547; G01R 31/3177
USPC ................... 714/726, 741, 729, 727
See application file for complete search history.

(56) References Cited

U.S. PATENT DOCUMENTS

| | | | | |
|---|---|---|---|---|
| 5,592,493 A * | 1/1997 | Crouch et al. | ................ | 714/729 |
| 5,793,778 A * | 8/1998 | Qureshi | ........................ | 714/727 |
| 5,886,901 A * | 3/1999 | Magoshi | ....................... | 716/113 |
| 7,823,034 B2 * | 10/2010 | Wohl et al. | .................... | 714/726 |
| 7,831,876 B2 * | 11/2010 | Goyal et al. | .................. | 714/729 |
| 7,886,207 B1 * | 2/2011 | Solt | ................ | 714/726 |
| 7,941,717 B2 * | 5/2011 | Waayers | ....................... | 714/727 |
| 7,941,719 B2 * | 5/2011 | Waayers | ....................... | 714/729 |
| 7,979,763 B2 * | 7/2011 | Wohl et al. | .................... | 714/728 |
| 8,286,041 B2 * | 10/2012 | Kawasaki et al. | ............. | 714/726 |
| 2004/0237015 A1 * | 11/2004 | Abdel-Hafez et al. | ........ | 714/726 |
| 2005/0060625 A1 * | 3/2005 | Wang et al. | .................... | 714/727 |
| 2005/0138509 A1 * | 6/2005 | Kiryu et al. | ................... | 714/726 |
| 2005/0268194 A1 * | 12/2005 | Wang et al. | .................... | 714/733 |
| 2006/0064614 A1 * | 3/2006 | Abdel-Hafez et al. | ........ | 714/726 |
| 2008/0288838 A1 * | 11/2008 | Anzou | .......................... | 714/726 |
| 2008/0288842 A1 * | 11/2008 | Waayers et al. | ............... | 714/729 |
| 2009/0106613 A1 * | 4/2009 | Goyal et al. | ................... | 714/729 |
| 2010/0269004 A1 * | 10/2010 | Flynn | ............................ | 714/746 |
| 2010/0313089 A1 * | 12/2010 | Rajski et al. | .................. | 714/731 |

* cited by examiner

*Primary Examiner* — Albert Decady
*Assistant Examiner* — Osman Alshack
(74) *Attorney, Agent, or Firm* — Robert D. Marshall, Jr.; Frederick J. Telecky, Jr.

(57) ABSTRACT

This invention permits selectively bypasses serial scan chains. Constant or low toggle data is directed to the bypassed serial scan chain, thus reducing power consumption. The number and identity of serial scan chains bypassed during a particular test can be changed dynamically dependent upon the semiconductor process variations of a particular integrated circuit. This enables an optimal test to be preformed for integrated circuits having differing semiconductor process variations.

7 Claims, 7 Drawing Sheets

SCAN COMPRESSION ARCHITECTURE WITH BYPASSABLE SCAN CHAINS FOR LOW TEST MODE POWER

CLAIM OF PRIORITY

This application claims priority under 35 U.S.C. 119(e)(1) to U.S. Provisional Application No. 61/236,753 filed Aug. 25, 2009.

TECHNICAL FIELD OF THE INVENTION

The technical field of this invention is integrated circuit testing and more specifically testing using scan chains while mitigating power consumed by the integrated circuit during testing.

BACKGROUND OF THE INVENTION

Semiconductor manufacturers typically test integrated circuits to weed out defective integrated circuits after fabrication. It is typical in the art to divide the whole device under test into plural sets of scan chains consisting of flip-flops storing various states of the device. These flip-flops generally correspond to state storing portions of the device. Each scan chain has an input, a serial set of flip-flops holding a subset of the states of the device under test and an output. Such serial scan chains permit testing of the circuit under test as follows. Data is loaded into the registers of the circuit under test via the serial scan chains in a test mode. In the test mode each scan chain provides a serial path between an input, some of the data registers of the circuit under test and an output. This sets the conditions of the circuit under test into a desired state by scanning in appropriate data. The set of parallel scan chains are generally designed to include registers storing data relevant to the internal condition of the circuit under test. After loading the data in this manner, the circuit under test operates in a normal mode responsive to its own clock signal for an interval. This operational interval results in a changed state of the device under test reflected in an altered set of states in the flip-flops of the scan chains. The altered internal state of the circuit under test is output via the same scan chains. This view of the internal state of the circuit under test is compared with an expected state. It is typical to scan in a new initial state for a next test while scanning out data from a prior test.

Integrated circuit test typically uses data compression to transfer data into and out of the tested integrated circuit. This is often called scan based test. Typical designs include many tens or hundreds of separate scan chains. The number of inputs and outputs available for test is typically much smaller and may be less than ten. It is known in the art to employ test data compression for this problem. The test pattern supplied to the integrated circuit is compressed before supply. A decompressor in the integrated circuit receives the compressed data and generates decompressed test data for application to the plural serial scan chains. A compactor typically receives the scan out data from the plural serial scan chains and compacts this data for output via the few output lines.

There are some disadvantages to this scanned based test technique. When scanning in data during initialization and scanning out data following a test, generally more flip-flops will toggle than during any operational mode of the integrated circuit. This has adverse implications for the power consumption of the device. Scanning a device under test may consume much more power than the designed operating power. This may adversely impact the thermal design of the integrated circuit. This thermal problem may be mitigated by scanning at a clock frequency much smaller than the operating frequency. This technique may reduce the average power consumption to within the thermal design of the operating device. At that same time a reduced scanning rate would increase scan-in and scan-out times and consequently the test time. This technique would not reduce the peak power which is dependent upon the number of flip-flops switching simultaneously. Switching a large number of flip-flops simultaneously may cause improper operation of the scan chain due to large IR voltage drops.

SUMMARY OF THE INVENTION

These difficulties in test operations can be mitigated by the present invention. This invention permits selective bypassing of each of the serial scan chains (often called a STUMPS channel). The bypassed serial chains can be loaded with constant of low toggle data supplied within the integrated circuit. An example of this invention scans in 0s so that every flip flop goes through a 0 to 0 transition. Alternately scanning in all 1s causes every flip flop to go through a 1 to 1 transition. Where the bypassed serial scan chains have data inversion logic in the scan path, the scanned in sequence can have a set of 0s and 1' that minimize the overall toggle activity to minimize power consumption. Because a serial scan chain generally includes hundreds of flip-flops, directing constant or low toggle data into the serial scan chain can save considerable power. While bypassing a serial scan chain, the normal scan-in data is directed to a bypass flip-flop to ensure an unbroken scan path between decompressor and compactor.

In another aspect of the invention, each serial scan chain of the device under test is equipped with such a bypass. The number and identity of serial scan chains bypassed during a particular test can be changed dynamically dependent upon the semiconductor process variations of a particular integrated circuit. This enables an optimal test to be preformed for integrated circuits having design characteristics and differing semiconductor process variations.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
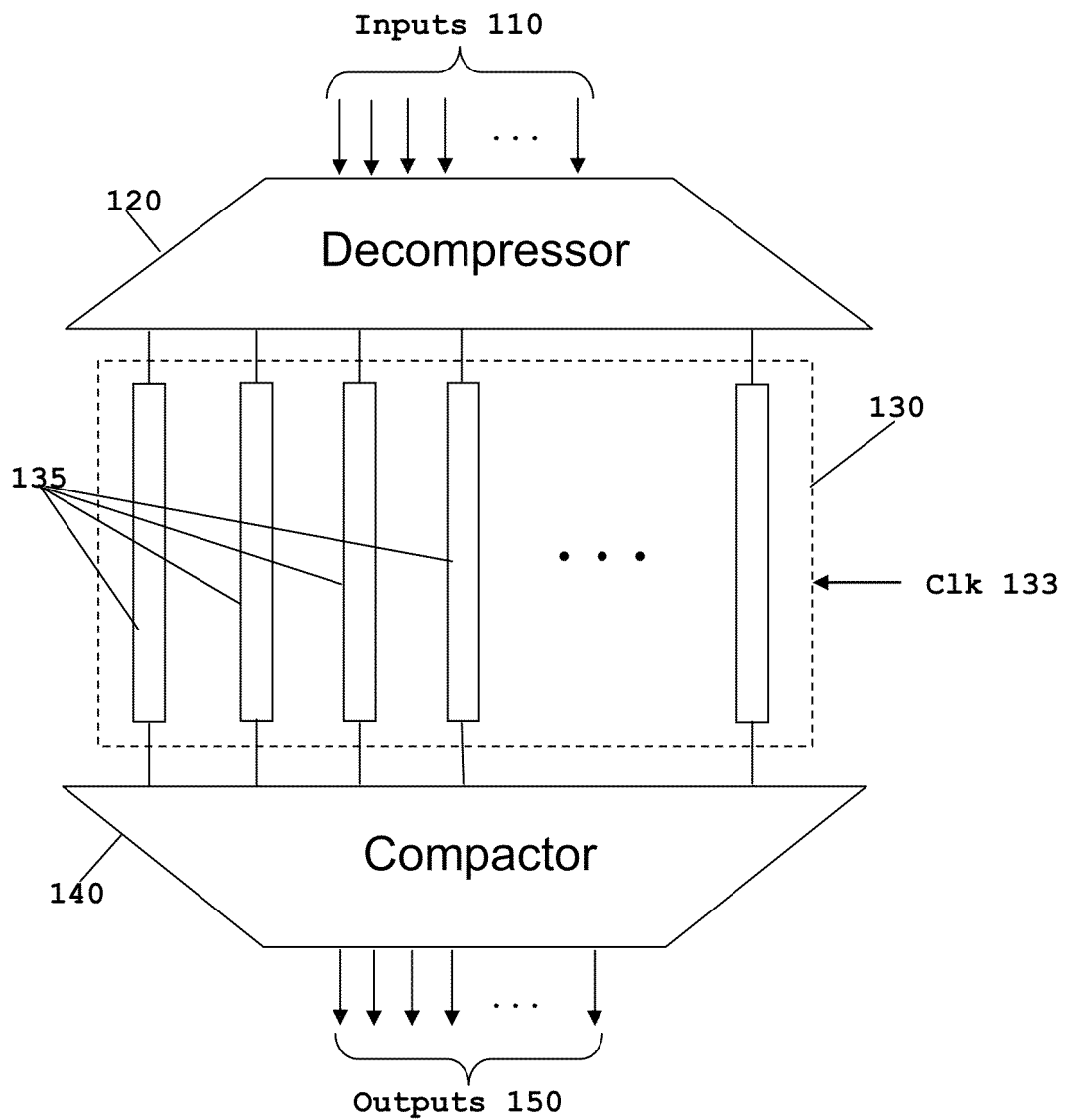
FIG. 1 is a block diagram illustrating testing a circuit using plural serial scan chains according to the prior art.

FIG. 1 illustrates the prior art compressed input data testing technique. An external tester (not illustrated) supplies compressed test data to inputs 110. Decompressor 120 decompresses this compressed test data and divides it into plural data streams. Decompressor 120 supplies these plural data streams to plural serial scan chains 135 of the circuit under test 130. Each serial scan chain 135 produces an output supplied to compactor 140. Compactor 140 compresses these data streams into a smaller set of outputs 150. Outputs 150 are supplied to the external tester for comparison with expected output data. This comparison indicates whether circuit under test 130 is operating as expected.

Figure 2:
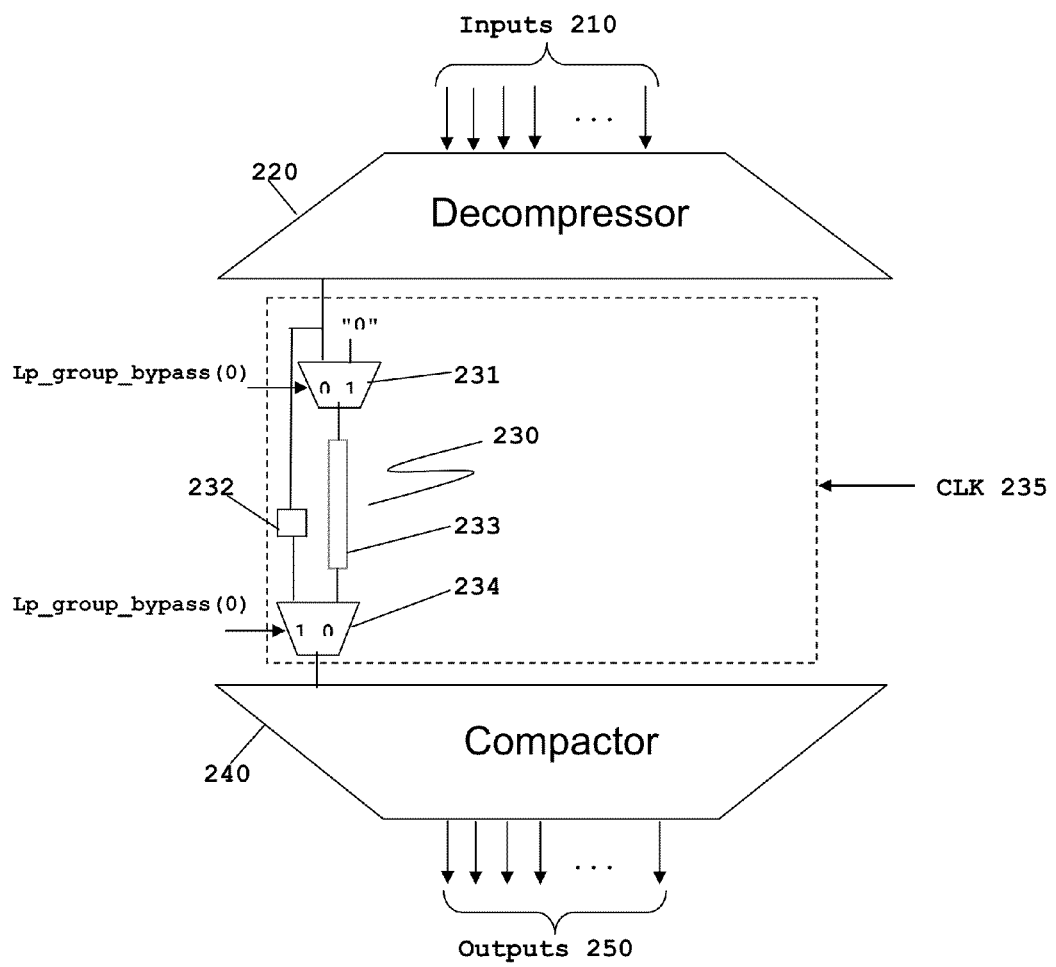
FIG. 2 is a block diagram illustrating key features of this invention.

FIG. 2 illustrates key points of the present invention. FIG. 2 illustrates decompressor 220 similar to FIG. 1 receiving inputs 210. FIG. 2 further illustrates compactor 240 similar to FIG. 1. FIG. 2 illustrates a single serial scan chain 230 as an example. Serial scan chain 230 is representative of the plural serial scan chains connecting serial scan chains of flip-flops of the device under test. A practical embodiment of this invention will include many such serial scan chains, perhaps hundreds. Each serial scan chain 230 has a corresponding input multiplexer 231, a bypass flip-flop 232, flip-flop chain 233 and an output multiplexer 234.

Input multiplexer 231 includes two inputs. A first input labeled 0 connects to an output from decompressor 220 corresponding to the associated flip-flop chain 233. A second input labeled 1 receives a constant. The example of FIG. 2 shows this constant input is "0." Multiplexer 231 has a single output connected to the input of flip-flop chain 233.

Bypass flip-flop 232 receives an input from the corresponding output of decompressor 220 for the associated serial scan chain 230 in parallel with multiplexer 231. Bypass flip-flop 232 has an output connected to one input of output multiplexer 234.

Output multiplexer 234 has two inputs. A first input labeled 0 receives the output of the associated flip-flop chain 233. As noted above, a second input labeled 1 receives the output of bypass flip-flop 232. Output multiplexer 234 has a single output connected to the input of compactor 240 for the associated serial scan chain 230.

Input multiplexer 231 and output multiplexer 234 are both controlled by the same control signal Lp_group_bypass(n), where n corresponds to the index number of the group including the associated serial scan chain 230. The representative serial scan chain 230 in FIG. 2 is the 0-th group. The polarity of control of input multiplexer 231 and output multiplexer 234 are as follows. When the corresponding control signal Lp_group_bypass(n) is 0 then: input multiplexer 231 supplies the associated serial scan chain output of decompressor 220 to flip-flop chain 233; and output multiplexer 234 supplies the output of flip-flop chain 233 to the input of compactor 240 of the associated serial scan chain 230. When the corresponding control signal Lp_group_bypass(n) is 1 then: input multiplexer 231 supplies the constant "0" to the input of flip-flop chain 233; and output multiplexer 234 supplies the output of bypass flip-flop 232 to the input of compactor 240 of the associated serial scan chain 230. Thus this circuit operates in two modes. When Lp_group_bypass(n) is 0 then: flip-flop chain 233 receives the associated output from decompressor 220 and supplies its output to the associated input of compactor 240. When Lp_group_bypass(n) is 1 then: bypass flip-flop 232 receives the associated output from decompressor 220 and supplies its output to the associated input of compactor 240; and flip-flop chain 233 receives the constant "0" input and the output of flip flop chain 233 is discarded and not used.

This circuit saves power as follows. When Lp_group_bypass(n) is 0, then flip-flop chain 233 receives a corresponding part of the test pattern. Passing this test pattern down the serial scan chain causes some of the flip-flops within serial scan chain to change state. The state changes depend upon the test pattern input. This causes electrical energy consumption estimated as follows:

$$\text{Energy} = \alpha \times N \times E \quad (1)$$

where: N is the total number of flip-flops in the serial scan chain; $\alpha$ is the fraction of the flip-flops switching; and E is the amount of electrical energy used on each flip-flop switch. Note this assumes that the flip-flops of serial scan chain 230 are all identical and use identical switching energy. The fraction of the flip-flops switching depends upon the test pattern entered. A test pattern that alternated 1s and 0s would tend cause every flip-flop to switch every clock cycle making $\alpha=1$. This would cause a maximum energy use. In a test pattern input having a typical distribution of 0s and 1s, then on average half the flip-flops of serial scan chain 230 change state each clock cycle making $\alpha=0.5$. The power consumption estimate (rate of energy use per unit time) equals:

$$\text{Power} = \alpha \times \text{Energy} \times f \sum_{i=1}^{M} N_i \quad (2)$$

where: M is the number of serial scan chains within the device under test; $N_i$ is the number of flip-flops in the i-th serial scan chain; and f is the switching frequency. If all serial scan chains have the same length N, then the summation becomes MN.

From equation (2) consider various methods to reduce power consumption during scan. The fraction of switching flip-flops $\alpha$ depends upon the test pattern and cannot be independently controlled. That is, the desired test coverage will control the test pattern. It may not be possible to achieve low switching during scan by test pattern selection while meeting a test coverage goal. The energy used per switch Energy will generally depend upon the circuit employed and the semiconductor process parameters of a particular integrated circuit. These factors will generally not be independently controllable to reduce scan power. The clocking frequency f can be independently controlled to control power consumption. Reducing the clocking frequency f will reduce the electric power consumption accordingly. This frequency reduction will cause an inverse increase in the time to complete scan and consequently the test time. Thus while test power consumption can be reduced by reducing the scan clock frequency, this adversely increases the test time. Note that a reduced clocking frequency only reduces average power and does not change peak power. A final manner of reducing power consumption is to reduce the number of flip-flops switching. This invention achieves this.

When Lp_group_bypass(n) is 1 then flip-flop chain 233 receives a constant input. The example of FIG. 2 illustrates a constant "0" input. Each clock cycle shifts the input constant into the serial scan chain. After the constant has been shifted into a flip-flop, that flip-flop no longer switches during following clock cycles. Thus as the constant shifts into the serial scan chain fewer and fewer flip-flops will switch. This reduces the consumed electric power, thus reducing overall switching power.

Figure 3:
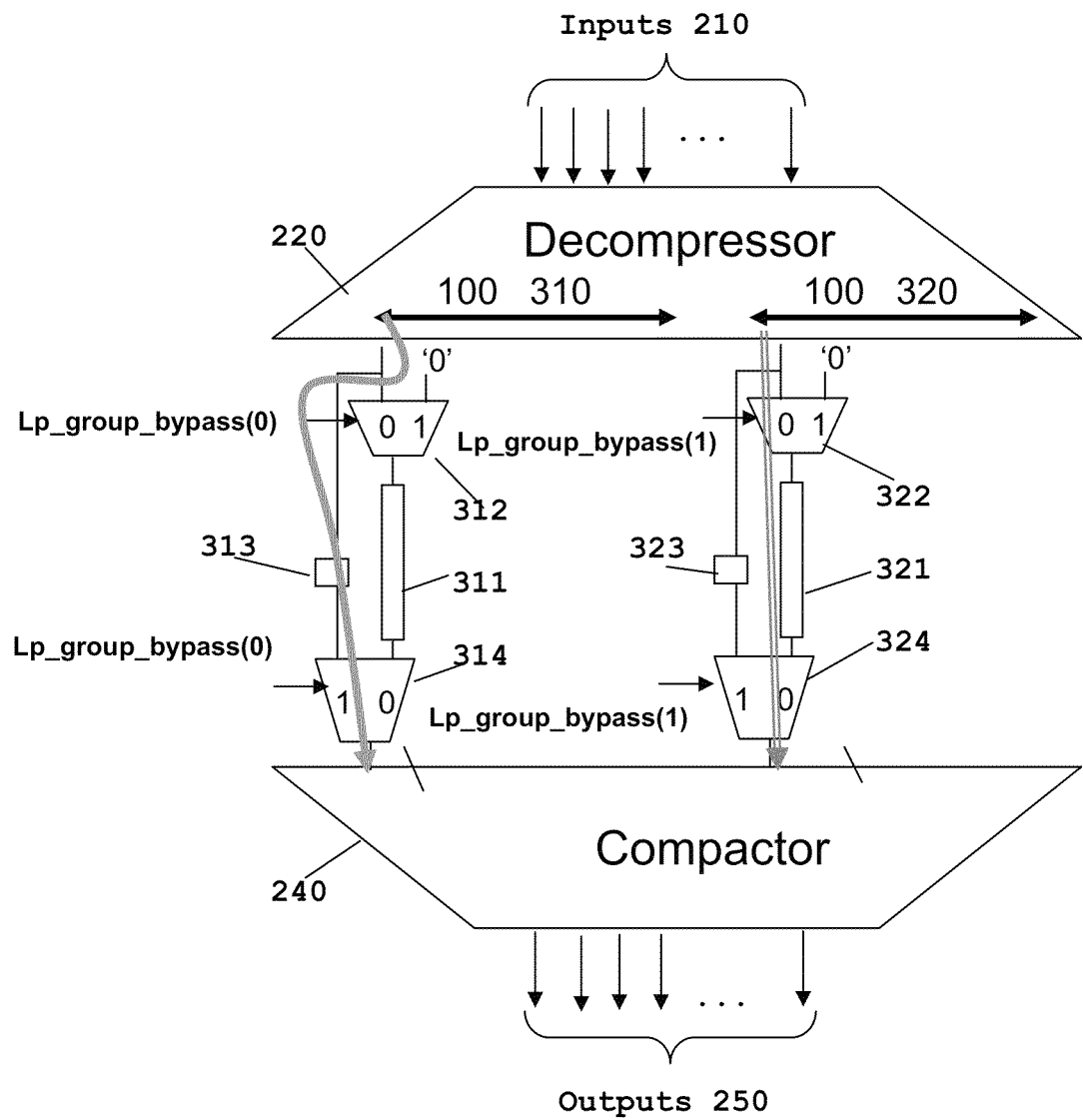
FIG. 3 is a block diagram illustrating a use example of this invention.

FIG. 3 illustrates an example of control of the number of serial scan chains switching according to this invention. FIG.

3 illustrates 200 serial scan chains. A first 100 group 310 includes serial scan chains 311. Each serial scan chain 311 has an associated input multiplexer 312, bypass flip-flop 313 and output multiplexer 314. Each input multiplexer 312 and output multiplexer 314 receives a control signal Lp_group_bypass(0). A second 100 group 320 includes serial scan chains 321. Each serial scan chain 321 has associated input multiplexer 322, bypass flip-flop 323 and output multiplexer 324. Each input multiplexer 322 and output multiplexer 324 receives a control signal Lp_group_bypass(1). Table 1 shows the status of groups 310 and 320 depending upon the states of the signals Lp_group_bypass(0) and Lp_group_bypass(1).

TABLE 1

| Lp_group_bypass(0) | Lp_group_bypass(1) | Mode of Operation |
| --- | --- | --- |
| 0 | 1 | Second hundred serial scan chains in low power mode |
| 1 | 0 | First hundred serial scan chains in low power mode |
| 0 | 0 | Regular non-low power mode |

The second group 320 is in low power mode when Lp_group_bypass(0) is 0 and Lp_group_bypass(1) is 1. The first group 310 is in low power mode when Lp_group_bypass(0) is 1 and Lp_group_bypass(1) is 0. Both groups 310 and 320 are in regular non-low power mode when Lp_group_bypass(0) is 1 and Lp_group_bypass(1) is 1.

FIG. 3 illustrates schematically the resultant signal routing when Lp_group_bypass(0) is 1 and Lp_group_bypass(1) is 0. For scan chains of first group 310, Lp_group_bypass(0)=1 causes input multiplexer 312 to supply the constant "0" to serial scan chains 311 and causes output multiplexer 314 to select data from bypass flop 313. For scan chains of second group 320, Lp_group_bypass(1)=0 causes input multiplexer 322 to supply the corresponding output from decompressor 220 to serial scan chains 321 and causes output multiplexer 324 to select data from serial scan chains 321.

For intellectual property (IP) modules within the device under test there are two possible parsing of the serial scan chains with regard to that module. All serial scan chains of the module could be placed within the same scan group. Thus all serial scan chains of the module would either be selected for test or not selected and placed in the low power mode based upon the corresponding Lp_group_bypass values. Alternatively the serial scan chains of the module could be placed in at least two different scan groups. Different serial scan chains of the module would get selected or bypassed dependent upon the Lp_group_bypass signals. This alternative enables opportunities to ensure that not all serial scan chains of the module will be selected by all or most test patterns. This allows for any power grid aware serial scan chain grouping.

Figure 4:
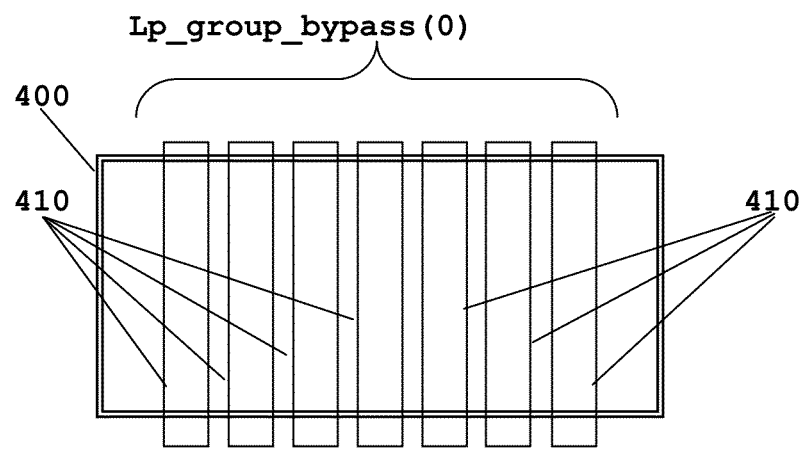
FIG. 4 illustrates an IP module divided into plural serial scan chains controlled by the same group signal.
Figure 5:
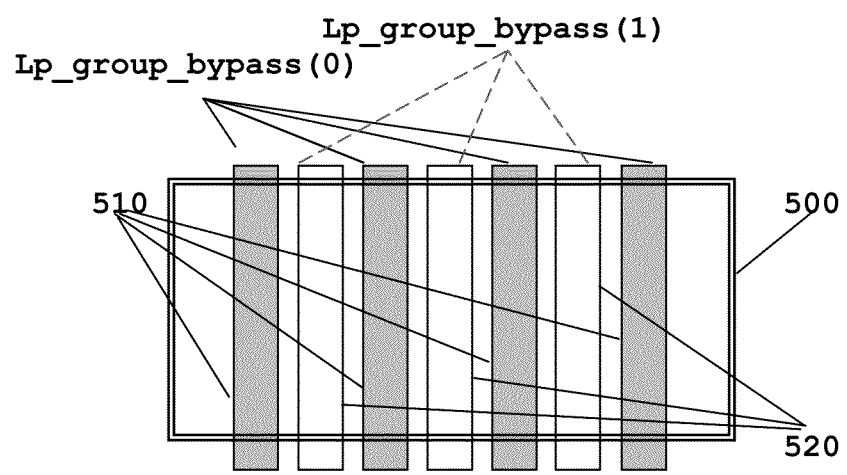
FIG. 5 illustrates an IP module divided into plural serial scan chains controller by differing group signals.

This situation is illustrated in FIGS. 4 and 5. FIG. 4 illustrates IP module 400 divided into plural serial scan chains 410. IP module 400 forms part of the integrated circuit under test. As shown in FIG. 4, all serial scan chains 410 are selected by the single signal Lp_group bypass(0). FIG. 5 illustrates IP module 500 divided into two IP bypass groups. IP module 500 forms part of the integrated circuit under test. The first bypass group of serial scan chains 510 is selected by the signal Lp_group_bypass(0). The second bypass group of serial scan chains 520 is selected by the signal Lp_group_bypass(1). The technique of FIG. 4 ensures all serial scan chains of IP module 400 are selected together. Depending upon the circuit type of IP module 400 this may be required for testing. The technique of FIG. 5 permits differing parts of IP module 500 to be scanned separately.

Testing of integrated circuits typically uses automated test pattern generation (ATPG) to produce the necessary test patterns. A typical ATPG system receives inputs corresponding to the circuit of the device under test including the identity and connectivity of the individual flip-flops in each serial scan chain. In general the number of flip-flops in the plural scan chains enables capture of each state or at least each significant state of the device under test. ATPG enables production of test patterns directed to test key features of the device under test. It is known in art to provide ATPG that is aware of and employs decompressor 220 and compactor 240 as shown in FIGS. 2 and 3. ATPG generally enables fast generation of test patterns having reasonable test coverage of the integrated circuit.

Figure 6:
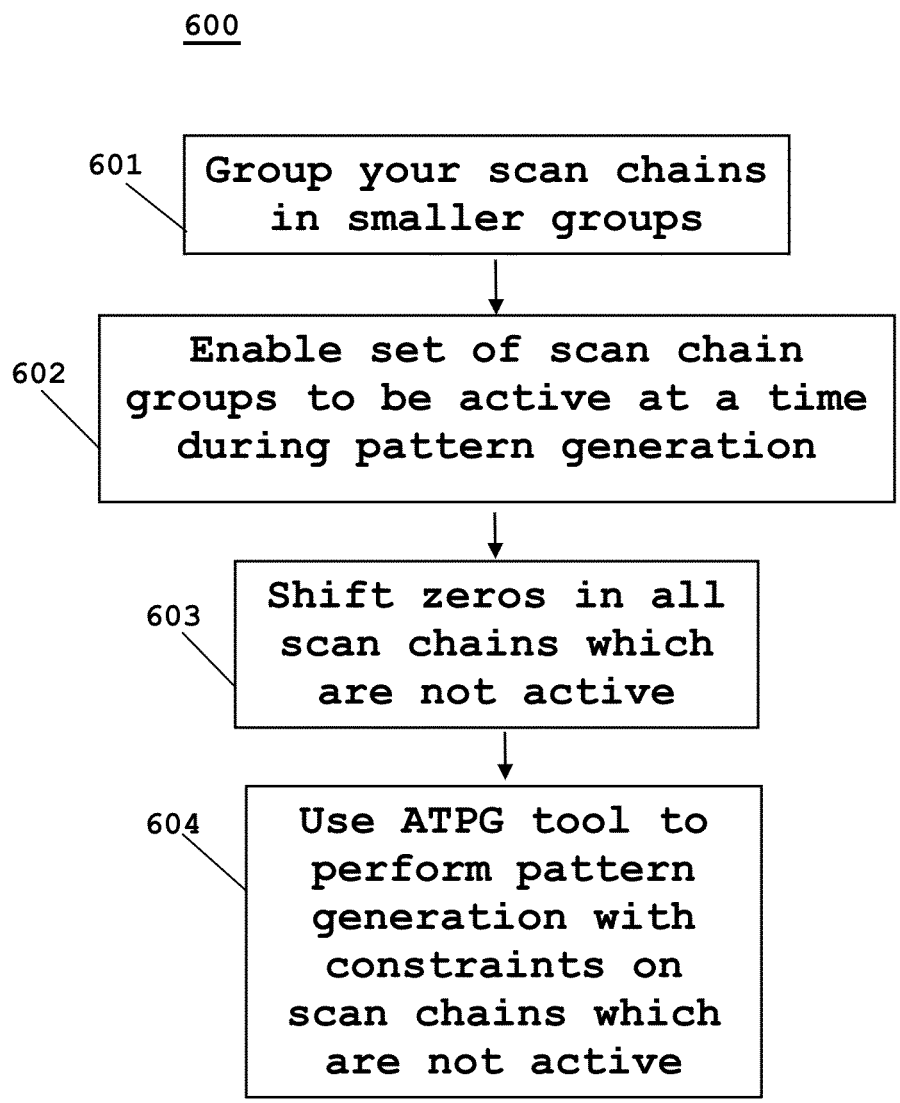
FIG. 6 is a flow chart illustrating the use of this invention with automatic test pattern generation.

FIG. 6 illustrates a flow chart 600 of use of this invention with ATPG. Step 601 groups the serial scan chains into smaller groups. This is illustrated in FIGS. 2 to 5. The set of serial scan chains M is divided into plural subsets independently bypassable with a corresponding Lp_group_bypass signal. Step 602 enables some or all of these plural subsets using the corresponding Lp_group_bypass signals. This occurs while an appropriate test pattern is supplied to the device under test. This process will be further described below. Step 603 supplies 0s to all scan chains not enabled by the corresponding Lp_group_bypass signal. Step 604 uses an ATPG tool for pattern generation with constraints on the bypassed scan chains that are not active during the corresponding scan.

Figure 7:
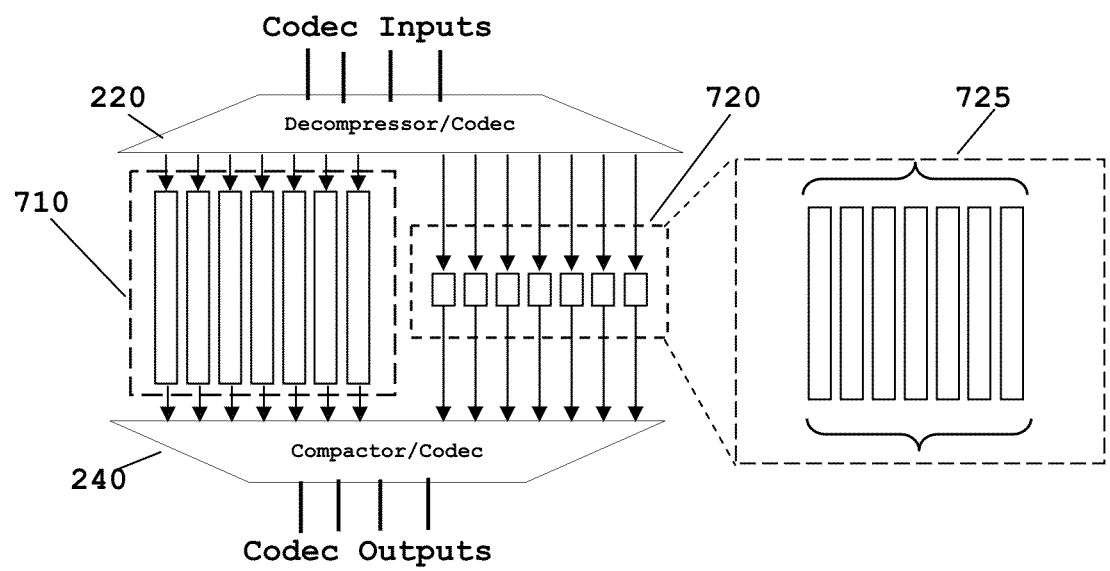
FIG. 7 illustrates a manner of using the capabilities of a current automatic test pattern generation tool to generate test patterns for use with this invention.

FIG. 7 illustrates a manner of using the capabilities of a current ATPG tool to generate test patterns for use with this invention. Current ATPG tools do not have the capability of generating test patterns suitable for this invention. This portion of the application will describe how to adapt an existing ATPG tool to use with this invention. This takes advantage of a feature within the ATPG tool that support of multiple scan compression partitions called codecs. The ATPG tool is commanded to provide a normal codec for the serial scan chains 710 to be tested. A second virtual codec is created for the bypassed serial scan chains 720. This virtual codec is programmed to mimic the 0 shift-in of this invention by constraining the flip-flops to 0 during shift in. This invention masks these serial scan chains on shift out. A real codec within decompressor 220 generates the test data for selected serial scan chains 710. A virtual codec within decompressor 220 generates constant test pattern data, in this case all 0s, for non-selected serial scan chains 720 resulting in a scanning virtual scan chains 725.

This invention may use the following sequence of steps. First, select the STUMPS channels to be bypassed. Enable the bypass flip-flops for these scan chains and thus bringing out the serial inputs for these chains as via the bypass flip-flops. Force constraints into the flip-flops in these STUMPS channels. For example, the pattern generation tool could initialize all these flip-flops to 0s or 1s according to the constraints. Generate test patterns using ATPG for the regular STUMPS and bypass STUMPS. The bypass flip-flop STUMP includes a virtual codec. The actual corresponding STUMP has already been initialized to 0s or 1s. Then ascertain coverage versus power. The invention then switches to another group of bypass STUMPS and in-use STUMPS.

The following is a description of application of this invention to an example integrated circuit design. The example integrated circuit includes 17 clock domains, 8 top level scan inputs, 971 serial scan chains including 241,666 total flip-flops with a maximum chain length of 270. This invention permitted bypassing a maximum of 500 serial scan chains. These 500 serial scan chains are further divided into five groups of 100 serial scan chains labeled G1, G2, G3, G4 and G5. These five groups can be independently bypassed employing this invention as controlled by CDR bits stored in a special purpose test register. CDR signal selects or deselects a corresponding group. If the corresponding CDR signal is 1, then that group is bypassed. If the corresponding CDR signal is 0, then that group is not bypassed. Thus a set of CDR bits "11111" bypasses all scan groups G1, G2, G3, G4 and G5. A set of CDR bits "11110" bypasses scan groups G1, G2, G3 and G4.

Figure 8:
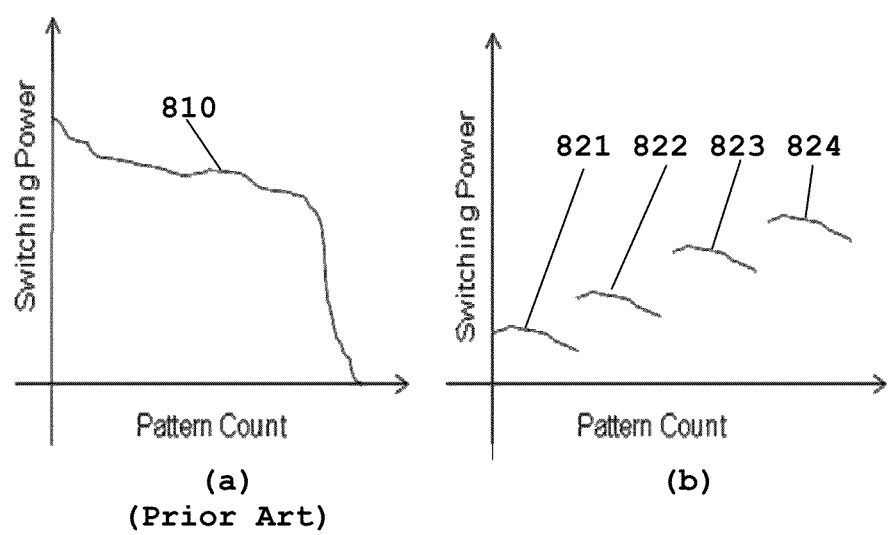
FIGS. 8(a) and 8(b) illustrate a comparison of the typical prior art relationship between switching power and pattern count and four switching power levels using the present invention.

FIG. 8(a) illustrates the typical relationship 810 between switching power and pattern count for prior art ATPG. The switching power 810 is initially high and reduces at high pattern counts.

FIG. 8(b) illustrates four switching power levels 821, 822, 823 and 824 using the present invention. Switching power level 821 bypasses all but one of scan groups G1, G2, G3, G4 and G5. Switching power level 822 bypasses all but two of scan groups G1, G2, G3, G4 and G5. Switching power level 823 bypasses two of scan groups G1, G2, G3, G4 and G5. Switching power level 824 bypasses one of scan groups G1, G2, G3, G4 and G5. As shown in FIG. 8(b) bypassing fewer scan groups results in greater switching power.

Figure 9:
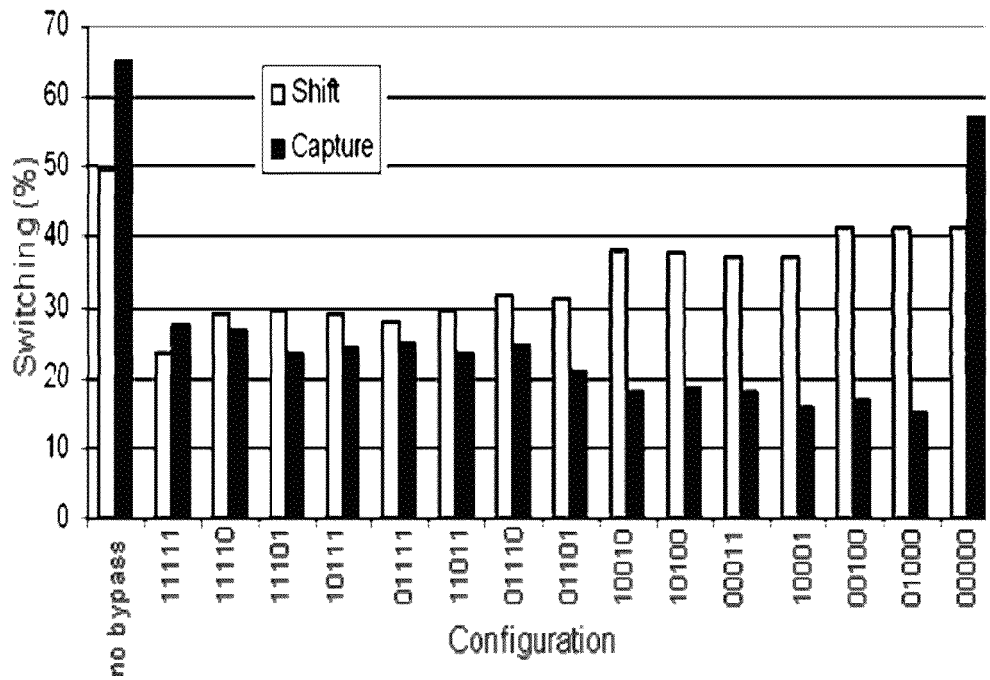
FIG. 9 illustrates the peak scan and capture switching percentage in the example design for a number of possible scan group configurations.

FIG. 9 illustrates the peak scan and capture switching percentage in the example design for progressive test pattern generation using a number of possible scan group configurations. These scan group configurations are noted in Table 2 and used in the order listed during test pattern generation. The test pattern generation starts with low power configurations and moves toward high power configurations.

TABLE 2

| Configuration | Configuration Label (Bit-wise Specification of 5 CDRs) |
|---|---|
| 1 | 11111 |
| 2 | 11110 |
| 3 | 11101 |
| 4 | 10111 |
| 5 | 01111 |
| 6 | 11011 |
| 7 | 01110 |
| 8 | 01101 |
| 9 | 10010 |
| 10 | 10100 |
| 11 | 00011 |
| 12 | 10001 |
| 13 | 00100 |
| 14 | 01000 |
| 15 | 00000 |

FIG. 9 shows the peak percentage of scan flip-flops switching for shift and for capture for the scan configurations listed in Table 2 with the non-bypassed shown as reference for a complete set of 25,247 test patterns. These patterns are generated by running these configurations serially from configuration (11111) to (00000) as listed left to right in FIG. 9 to achieve final test-coverage. Thus this starts from 500 chains bypassed configuration (11111) to no chains bypassed configuration (00000). The highest switching configuration (00000) configuration is used as the last configuration during pattern generation. This fact that allows the highest switching configuration to be used only for those faults which were previously untested in the lower switching configurations. The last bar in the graph has lower switching reported compared to the reference non-bypassed configuration for this reason.

Figure 10:
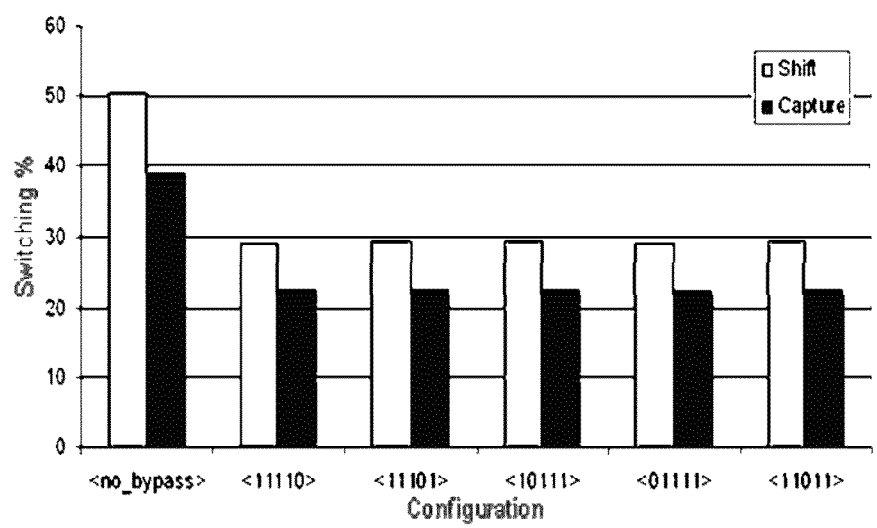
FIG. 10 illustrates the peak scan and capture switching percentage for five different low-power chain test patterns.

FIG. 10 illustrates the peak scan and capture switching percentage for 5 different low-power chain test patterns. The example configurations include "11110," "11101," "10111," "01111" and "11011." FIG. 10 shows shift and capture peak power profile for scan chain integrity test pattern which only applies one pattern to integrated circuit under test. In this pattern the chains are loaded with a known set of values and then unloaded to check the same values are shifted out. This ensures chain connectivity. The same peak power profile in scan integrity test pattern across the chosen configuration (each having 400 chains bypassed) because shift activity is similar in these configurations and during capture there is no clock activity. FIG. 10 also illustrates the no bypass case for comparison. Each of these configurations bypasses about 400 chains. FIG. 10 illustrates a reduction of about 40% in peak shift power and a reduction of about 43% is peak capture power as compared to the no bypass case.

What is claimed is:

1. An integrated circuit comprising:
   at least one integrated circuit input terminal;
   at least one integrated circuit output terminal;
   a plurality of scan chain circuits, each scan chain circuit including
      an input multiplexer having a first input receiving a constant digital signal, a second input connected to said at least one integrated circuit input terminal, an output and a control input receiving a corresponding control signal, said input multiplexer connecting said first input or said second input to said output dependent upon said control signal received at said control input;
      a serial scan chain of a plurality of bits having an input connected to said output of said input multiplexer and an output, each serial scan chain operable in a test mode to serially connect corresponding bits of an operational circuit of said integrated circuit;
      a bypass flip-flop of one bit having an input connected to said at least one integrated circuit input terminal and an output;
      an output multiplexer having a first input connected to said output of said bypass flip-flop, a second input connected to said output of said serial scan chain, an output connected to said at least one integrated circuit output terminal and a control input receiving said corresponding control signal, said output multiplexer connecting said first input or said second input to said output dependent upon said control signal received at said control input.

2. The integrated circuit of claim 1, further comprising:
   a decompressor having at least one input connected to said at least one integrated circuit input terminal and a plurality of outputs, each output connected to said second input of said input multiplexer of a corresponding one of said scan chain circuits, wherein said plurality of scan chain circuits are greater in number than said at least one integrated circuit input terminal and said decompressor decompresses data received from said at least one integrated circuit input terminal into signals supplied to said greater number of said scan chain circuits; and
   a compactor having a plurality of inputs, each input connected to said output of a corresponding one of said plurality of scan chain circuits and at least one output connected to said at least one integrated circuit output terminal, wherein said at least one integrated circuit output terminal are fewer in number than said plurality of scan chain circuits and said compactor compacts data received from said plurality of scan chain circuits into signals supplied to said fewer number of said at least one integrated circuit input terminal.

3. The integrated circuit of claim 1, wherein:
   said plurality of scan chain circuits are divided into at least two groups; and
   a corresponding control signal is separately supplied to said control inputs of said input multiplexer and said output multiplexer of each of said at least two groups of scan chain circuits.

4. A method of testing an integrated circuit comprising the steps of:
   supplying each of a first plurality of data streams to a corresponding plurality of scan chain circuits;
   for each scan chain circuit selectively scanning in the corresponding data stream to a single bit flip-flop or to a plural bit serial scan chain serially connecting corresponding bits of an operational circuit of said integrated circuit in a test mode, choosing a number of plural bit serial scan chains for selectively scanning in the corresponding data stream to meet a power consumption goal;
   operating the operational circuit for at least one clock cycle;
   for each scan chain circuit selectively scanning out data stored in the corresponding serial scan chain in the test mode;
   comparing the scanned out data with expected data.

5. The method of testing the integrated circuit of claim 4, further comprising the steps of:
   supplying a test pattern to the integrated circuit via a second plurality of integrated circuit input pins;
   decompressing the test pattern into said first plurality of data streams, said first plurality being greater than said second plurality;
   compacting scanned out data from said first plurality of scan chain circuits into a third plurality of output data streams output via the third plurality of integrated circuit output pins.

6. The method of testing the integrated circuit of claim 5, further comprising the step of:
   automatically generating the test pattern.

7. The method of testing the integrated circuit of claim 4, wherein:
   said step of selectively scanning in the corresponding data stream to the single bit flip-flop or to the plural bit serial scan chain sequentially selects less than all the plural bit serial scan chains in each of a plurality of tests, the subsets selected whereby a finite sequence selects all serial scan chains.

* * * * *